United States Patent [19]

Mettler et al.

[11] 4,149,605

[45] Apr. 17, 1979

[54] SCALE WITH DIGITAL DISPLAY

[75] Inventors: Erhard Mettler, Zollikon; Hans Frey, Volketswil, both of Switzerland

[73] Assignee: Mettler Instrumente AG, Greifensee, Switzerland

[21] Appl. No.: 888,639

[22] Filed: Mar. 21, 1978

[30] Foreign Application Priority Data

Apr. 19, 1977 [CH] Switzerland ........................ 4795/77
Nov. 14, 1977 [CH] Switzerland ...................... 13853/77

[51] Int. Cl.² .......................................... G01G 23/14
[52] U.S. Cl. .............................. 177/173; 177/DIG. 3
[58] Field of Search ............. 177/50, 164, 173, 210 R, 177/DIG. 3; 364/567, 568

[56] References Cited

U.S. PATENT DOCUMENTS

| 3,788,410 | 1/1974 | Allenspach et al. | 364/567 X |
|---|---|---|---|
| 3,807,516 | 4/1974 | Whitney | 177/164 |
| 4,063,604 | 12/1977 | Rock | 177/1 X |

FOREIGN PATENT DOCUMENTS

| 2325654 | 11/1973 | Fed. Rep. of Germany | 177/164 |
|---|---|---|---|
| 1402875 | 8/1975 | United Kingdom | 177/DIG. 3 |

Primary Examiner—George H. Miller, Jr.
Attorney, Agent, or Firm—Marianne Rich

[57] ABSTRACT

In known scales, switching from a fine to a course measurement range automatically decreases the resolution by at least one place. Since the change in range takes place in dependence upon the total weight applied to the scale, displayed values after taring still lack at least one significant digit relative to the fine indication. In the present invention this digit is reactivated automatically upon activation of the tare key if the weight after taring is less than the predetermined fine range limiting weight.

15 Claims, 8 Drawing Figures

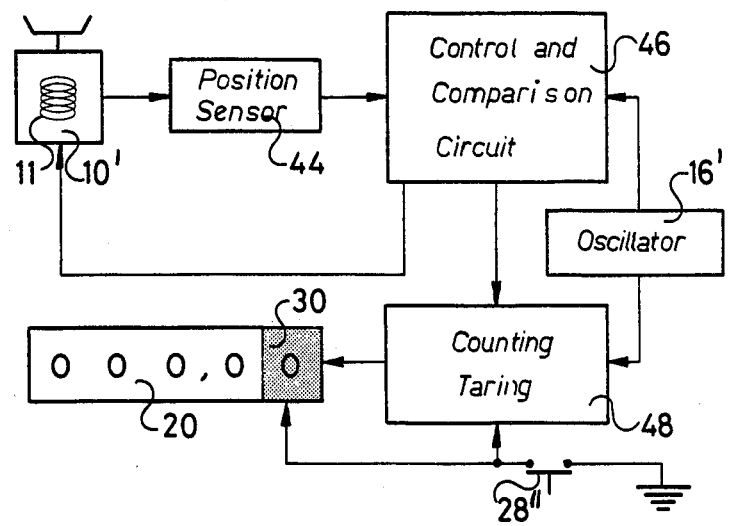
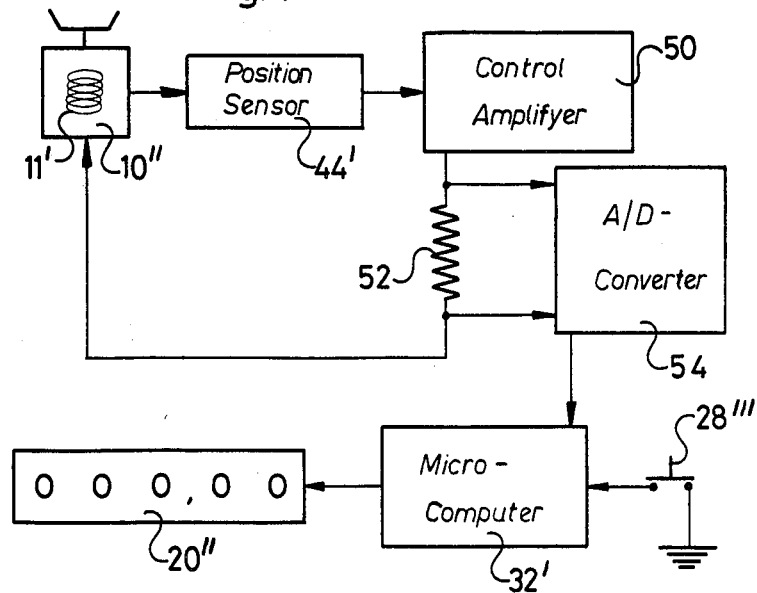

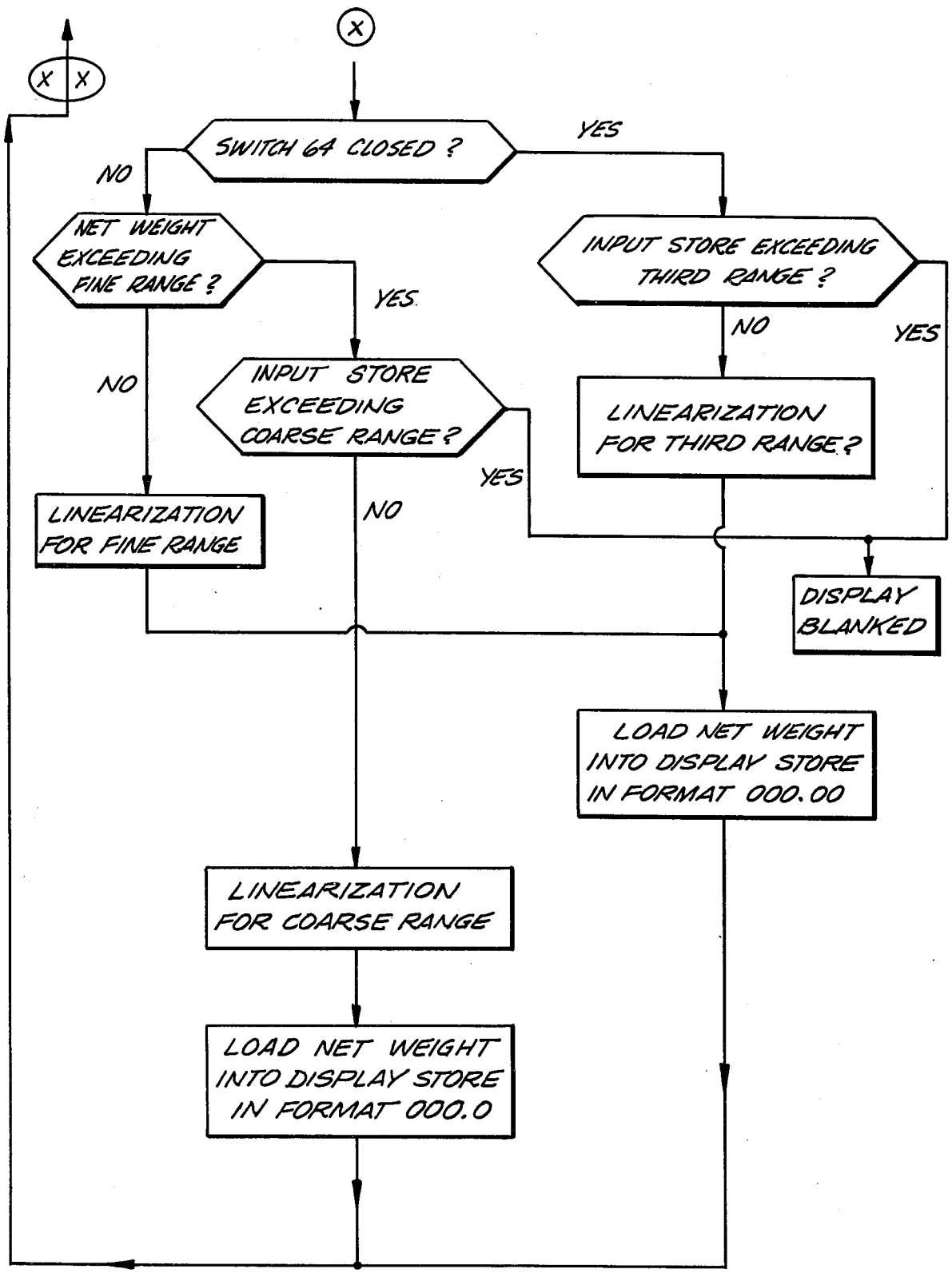
FIG. 8  3-RANGE SCALE

SCALE WITH DIGITAL DISPLAY

BACKGROUND OF THE INVENTION

This invention relates to scales having digital displays and operative within a coarse measuring range and a second smaller fine measuring range. The coarse measuring range lacks at least the least significant place of the fine measurement range. The invention further relates to such systems wherein means are provided for switching from one to the other of the measurement ranges.

In known scales of this type, the two ranges are provided in order to match the sensitivity of the scale to the weight of the load on the scale. The range switching in the known systems takes place manually, or automatically by means of a relay. All these known scales have a common feature, namely that both the coarse and the fine measurement range have the same zero point. In other words: when the total load on the scale has reached or exceeded a value corresponding to the predetermined fine range limiting weight, weighing can take place in the coarse measurement range only.

This limitation is often a considerable drawback. For example it may be a drawback when a successive weighing of a plurality of components of a mixture takes place or in the case of taring for a scale with subtractive tare (scales in which the range is reduced by the tare value) or for a combination of the two cases.

SUMMARY OF THE INVENTION

It is an object of the present invention to remove the above-described difficulty and to allow the measurement of each component of a mixture to full sensitivity even when the total load on the scale exceeds the predetermined fine range limiting weight.

The present invention relates to a scale having a coarse measurement range, and fine measurement range smaller than said coarse measurement range. The scale further has digital display means with a predetermined number of digits for displaying weight in said fine measurement range to at least one additional place of accuracy relative to said coarse measurement range. In accordance with the present invention, control means are provided which are responsive to external activation for switching to the starting point of said fine measurement range at any selected point within said coarse measurement range.

In a preferred embodiment of the invention, each of said digits of said digital display means represents a decimal digit. Other types of subdivisions (for example binary subdivisions) of the two weighing ranges could also be utilized.

Most of the scales affected by the present invention comprise taring means which may be activated under external activation of a tare key. In a preferred embodiment of the invention, the control means are connected to said tare key for activation therewith. This eliminates the need for a special key for activating the control means and further allows taring and switching to the fine measurement range to occur in synchronism.

In known scales having two measurement ranges, the display is blanked or a signal lamp is provided which indicates the crossing from the fine measurement range to the coarse measurement range. For the scales in accordance with the present invention, the embodiment is preferred in which display activating means are connected to the display for blanking at least the least significant place associated with the fine measurement range upon switching from said fine measurement range to said coarse measurement range. The user of the scale thus continues to receive an appropriate although abbreviated display and the shifting of the decimal point may be dispensed with. Of course this arrangement has the disadvantage that the display must have one additional place. If this is to be avoided, in accordance with another embodiment of the present invention, the number of indicated places is the same for the coarse and fine measurement range, but switching of the range causes the decimal point to be shifted by one place.

The range of application of scales utilizing the present invention is widened if, in accordance with a further preferred embodiment, a switch is provided which inhibits the change of range. With this switch, the scale may be utilized for applications in which a constant absolute accuracy is required and wherein therefore the weighing takes place in the coarse measurement range only. Also, use of this switch allows the change of range to be inhibited when the weight of the component happens to be close to the predetermined fine range limiting weight.

For scales having characteristic curves which are considerably more linear in the lower region than in the upper region, a third range can be provided which, however, has a fixed zero point. The range of weight which can be accommodated by the third range exceeds that of the fine range, but the accuracy and resolution correspond to that of the fine range or, in any case, are greater than provided in the coarse measurement range.

The present invention, both as to its construction and its method of operation, together with additional objects and advantages thereof, will best be understood from the following description of the preferred embodiments when read in connection with the accompanying drawing.

BRIEF DESCRIPTION OF THE DRAWINGS

FIG. 3 is a block diagram of a second embodiment of the present invention;

FIG. 4 is a block diagram of the third embodiment of the present invention;

FIG. 8 is a flow chart for the embodiment of FIG. 6.

DESCRIPTION OF THE PREFERRED EMBODIMENTS

Figure 1:
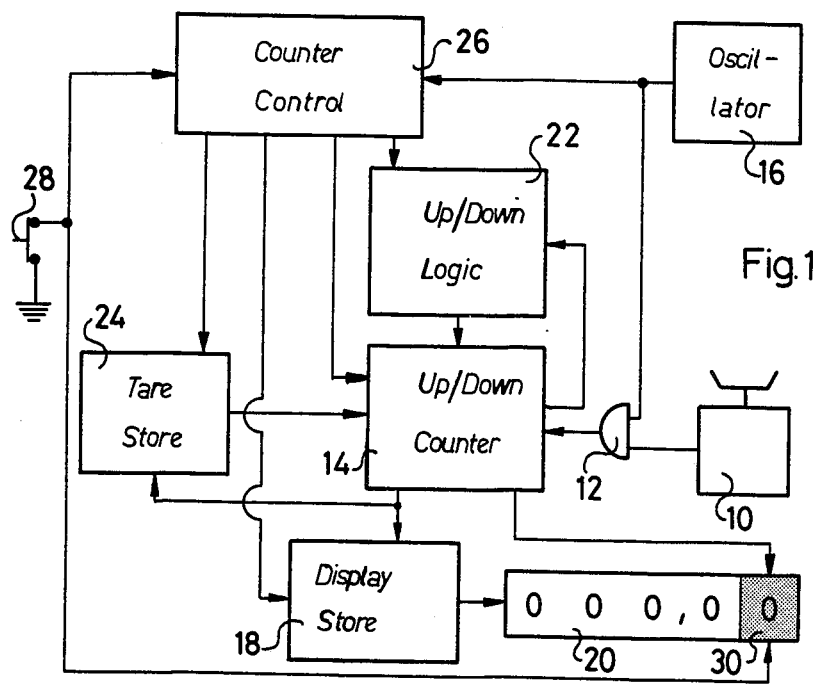
FIG. 1 is a block diagram of the first embodiment of the present invention.

The present invention will be described in relation to four different types of scales.

It will first be illustrated in relation to a scale such as described in U.S. Pat. No. 3,788,410. In this type of scale a vibrating string vibrates with a frequency $f_s$ which changes as a function of the load applied to the scale. The signal of frequency $f_s$ is applied through a gate 12 to an up/down counter 14. The time during which oscillations $f_s$ are counted is determined by an oscillator 16 whose output signal of frequency $f_r$ (possibly after frequency division) is applied to the second input of gate 12. The number of counts received by counter 14 within a predetermined measuring period or a predetermined plurality of measuring periods constitutes a measure for the load being weighed. The count on counter 14 is transferred to a display store 18 and from display store 18 to a five place display 20. Further, up/down logic 22, a tare store 24 and a counter control 26 are provided. By use of these elements, activation of a tare key 28 causes a net weight rather than a gross weight to be indicated. This operation is described in detail in U.S. Pat. No. 3,788,410 and will not be repeated here.

The above-described known scale is now modified as follows in accordance with the present invention: one output of counter 14 is connected to the display, as is one line from tare key 28. Counter 14 has a capacity of five decimal places corresponding to a coarse measurement range of 1000.0 g (maximum display value 999.9 g). At the start of each weighing the display includes all five places. If the total load applied to the scale is less than the predetermined fine range limiting weight (in a preferred embodiment 10% of the coarse range, that is 100.00 g), the display continues to exhibit the higher sensitivity. If, however, the total weight applied to the scale is increased above the fine range limiting weight, then the last place in the display, denoted by reference numeral 30 in FIG. 1, is blanked out. Specifically, upon overflow from four decimal places (corresponding to 100.00 g) counter 14 furnishes a signal to display 20 which blanks the last place. The display now operates in the coarse measurement region with a display shortened by one place following the decimal point.

Upon taring, the tare command automatically causes a reactivation of the last place 30 of display 20. Since counter 14 starts counting pulses for the net weight starting at zero after taking into account the tare value, the complete fine measurement range from zero to the predetermined fine range limiting weight of 100.00 g is again available.

This procedure can be repeated many times so that, for example when weighing a plurality of components of a mixture, each can be weighed to the highest resolution until the capacity of the coarse measurement range (corresponding to the maximum weight that can be handled by the scale) is reached.

Activation of the last place 30 of display 20 can be accomplished either directly by the activation of the tare key or may be derived from the zero passing of up/down counter 14. In each of these variations, the reactivation of the last place can be accomplished by resetting of a flip-flop (not shown) which was set by the signal from counter 14 and which, when set, inhibits the application of operating voltage to the last stage.

Oscillator 16 can, as is well known, be replaced by a reference string which oscillates at a frequency which is independent of the weight applied to the scale.

Figure 2:
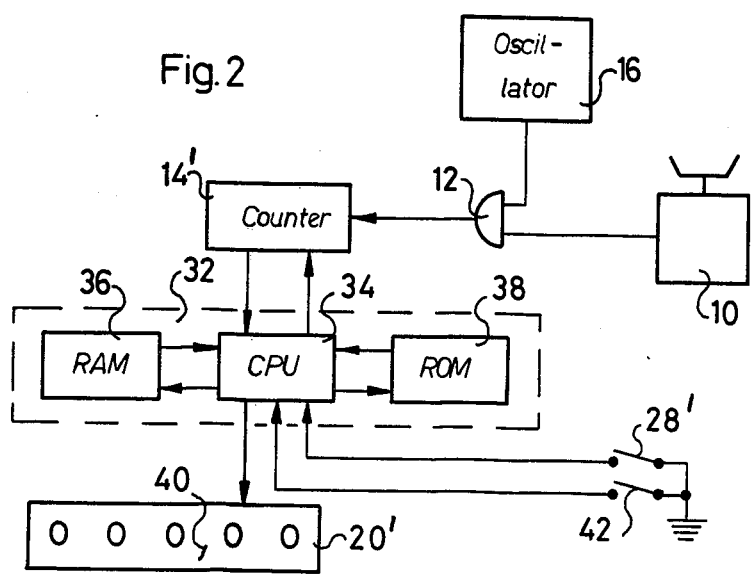
FIG. 2 is a variation of the embodiment shown in FIG. 1.

A variation of the embodiment shown in FIG. 1 is shown in FIG. 2. Here a microcomputer 32 is utilized. A weight-dependent signal is again furnished by a counter 14', which, however, is a unidirectional counter. The counting signal is applied to the central processing unit 34, where it is processed with the aid of a random access memory 36 in accordance with a program stored in a read-only memory 38. A tare key 28' is provided, as is a digital display 20' having a decimal point 40. In this embodiment, the system operates with a floating point, that is the decimal point 40 is moved by one place when the change is range takes place.

The change in range can be prevented by closing of a switch 42. This causes the two range scale to be converted into a single range scale which furnishes only the coarse display independent of the load being weighed. Further, with a microcomputer it is possible, by suitable programming, to provide individual linearization for the coarse and the fine weight ranges.

Figure 7:
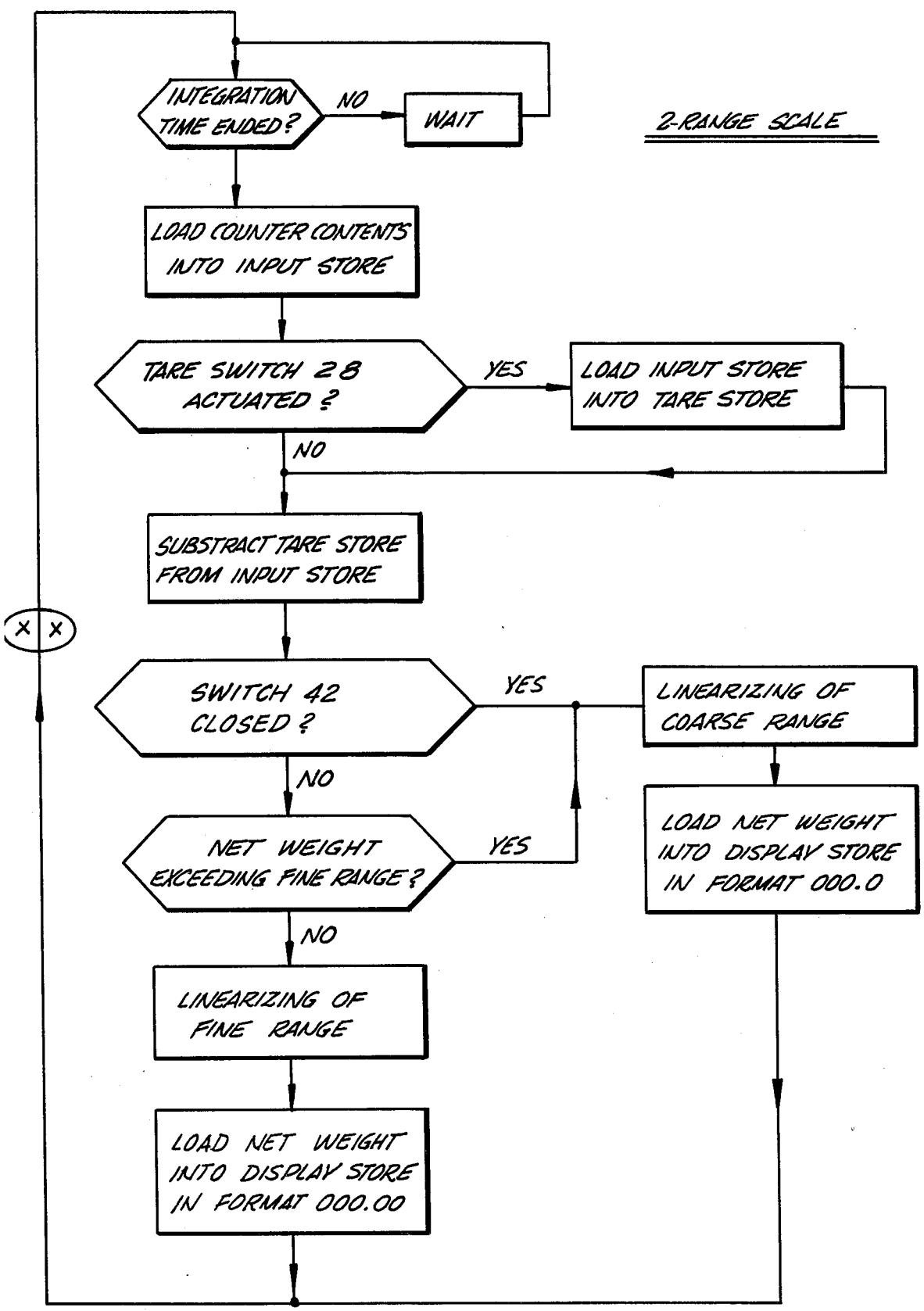
FIG. 7 is a flow chart for programming the microcomputer of FIG. 2.

A flow chart for a typical microcomputer program to accomplish the above is shown in FIG. 7.

The system tests whether the integration times has ended, that is whether counter 14' has finished counting. If not, it waits for a predetermined time period and then again tests for the end of the integration time. If the integration time has ended, the counter contents are loaded into the input store which is a permanently assigned location in the random access memory 36. The system then tests whether tare switch 28' has been activated. If yes, the number in the input store is read into the tare store, which is also a location in RAM 36. If tare switch 28' has not been activated or upon finishing of the loading of the input store into the tare store, the central processing unit 34, and more specifically, an add/subtract unit therein, is controlled to subtract the value stored in the tare store from that in the input store. The resulting net weight value is stored in a net weight store in RAM 36. The system then tests whether switch 42 is closed. If not, it further tests whether the net weight exceeds the fine range limiting weight. The latter test is carried out by subtracting the number in the net weight store in the RAM from the fine range limiting weight stored in ROM 38. If the result is a positive number indicating that the net weight is not greater than the fine range limiting weight, the program in ROM 38 switches to the fine linearization program. This operates upon the net weight values stored in RAM 36 until a final net weight value is obtained which, as indicated in FIG. 7, is loaded into the display store in format 000.00.

If however switch 42 was closed or the net weight did exceed the fine range limiting weight, the program is switched to the coarse range linearization program. Under these conditions the computed net weight is loaded into the display store in format 000.00. The cycle then repeats.

The second type of scale utilizing the present invention is shown in FIG. 3. A scale 10' operates by means of electromagnetic compensation by current pulses, as described in detail in U.S. Pat. No. 3,786,884. The scale has taring means. To summarize its operation, while the scale is being loaded a position signal generator 44 furnishes a position signal which is applied to a control and comparator circuit 46. Control and comparator circuit 46 periodically determines the length of time during which a compensation current i is applied to a compensation coil 11 located in the field of a permanent magnet. When the load and the electromagnetic compensation force are in equilibrium, the pulse width of the pulses applied to the compensation coil constitutes a measure of the load being weighed. A high frequency oscillator 16' furnishes timing pulses which are gated to a counter and tare circuit 48 by the aforementioned pulses so that the total number of pulses received by circuit 48 corresponds to the pulse width and thereby to the load applied to the scale. Periodically, the number stored in circuit 48 is transferred to a display 20.

In accordance with the present invention and analogously to the examples shown in FIGS. 1 and 2, a predetermined place on the display is blanked when a predetermined decimal place on the counter flows over. When a tare key 28'' is activated, thereby initiating a tare process, the last display place 30 is reactivated and the full sensitivity is again available for weighing the next subsequent component.

Again, a microprocessor could be utilized with this type of scale as it was with the scale shown in FIG. 1.

The scale shown in FIG. 4, 10'', is the same type as shown in FIG. 3, but operates on analog rather than a digital basis. Specifically, coil 11' receives a continuous DC current whose amplitude varies as a function of the amplitude of the signal from a position sensor 44'. The signal from position sensor 44' is applied to an operational amplifier 50 whose output is the compensating current applied to coil 11'. A voltage proportional to this compensating current is derived from a measuring resistor 52 and applied to an analog/digital converter 54. The digital output of converter 54 is applied to a microcomputer 32' whose output is applied to a digital display 20''. When the total weight applied to the scale reaches the predetermined fine range limiting weight, the program in microcomputer 32' causes a switching of the range from the fine measurement range to the coarse measurement range. If tare key 28''' is activated, the program in microcomputer 32' switches back to the fine measurement range.

Figure 5:
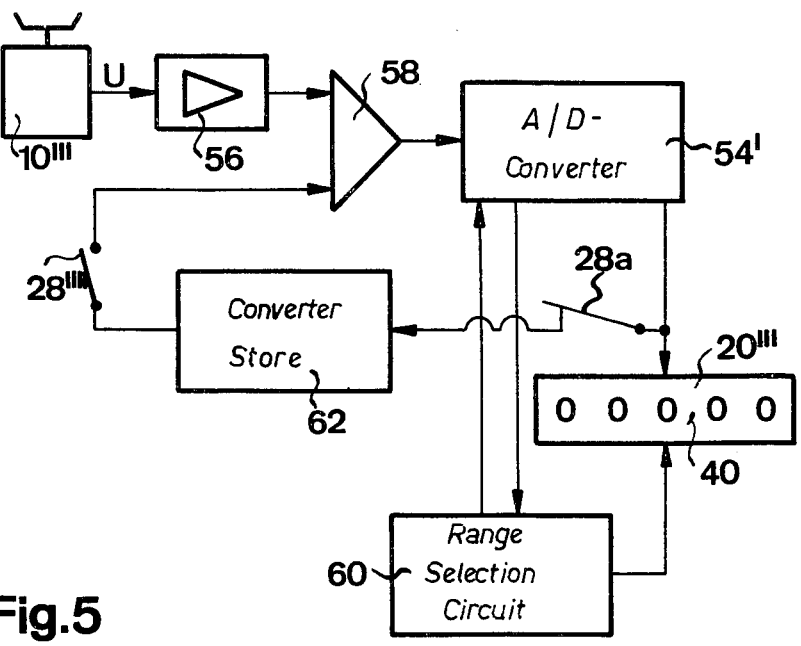
FIG. 5 is a block diagram of a fourth embodiment.

In FIG. 5, the present invention is applied to a spring scale 10''' which includes electrical sensing of the spring position. A signal U having an amplitude proportional to the load applied to the scale is applied to the input of an operational amplifier 56 whose output is connected to the direct input of a difference amplifier 58. The output of difference amplifier 58 is applied to an analog/digital converter 54' whose output is connected to a digital display 20'''. A range selection circuit 60 is connected to analog/digital converter 54'. When the output of the converter exceeds the value corresponding to the predetermined fine range limiting weight, as determined by a threshold circuit, range selection circuit 60 causes converter 54' to switch from the fine measurement range to the coarse measurement range. Simultaneously decimal point 40 in display 20''' is moved correspondingly.

When a tare key 28'''' is activated, a tare voltage is applied to the inverting input of difference amplifier 58. The tare voltage has an amplitude corresponding to the then-present output of analog/digital converter 54', which is stored in a tare store 62. The input of tare store 62 is disconnected from the output of converter 54' by a switch 28a which opens when tare key 28'''' closes. The output of difference amplifier 58 will then, throughout the remaining measurement, be equal to the difference between the value signified by signal U and the tare voltage. Since this difference is zero immediately after taring, the output of analog/digital converter 54' will also be zero and the display 20''' will be set to the fine measurement range.

Figure 6:
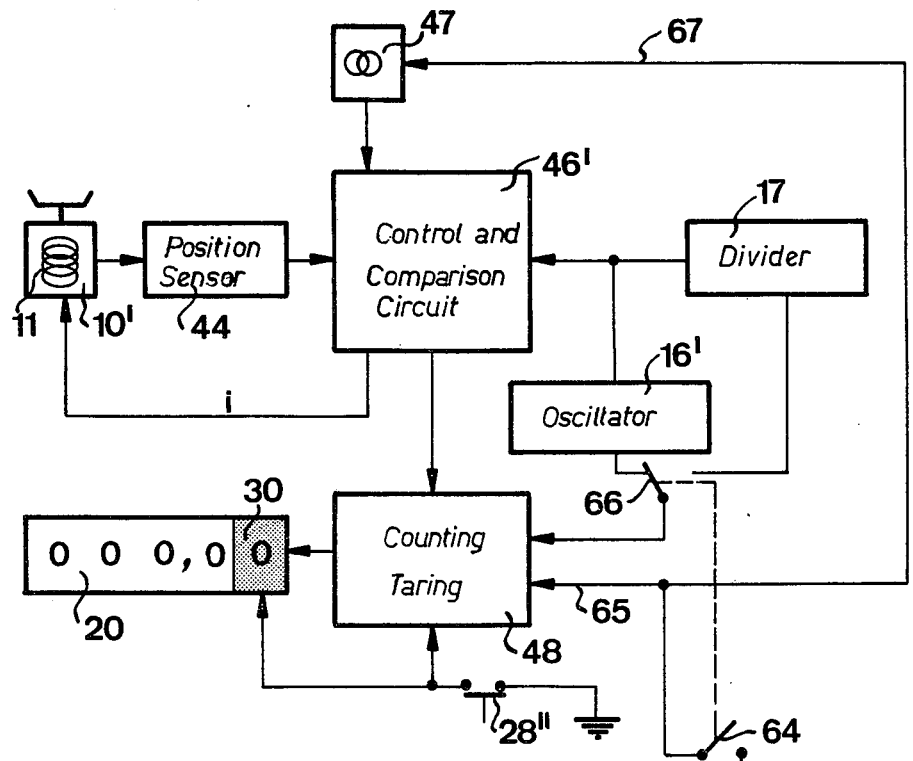
FIG. 6 is a block diagram of a fifth embodiment.

The embodiment of the invention shown in FIG. 6 is shown cooperating with the same type of scale as shown in FIG. 3, but is in no way limited to such an application. This embodiment takes into account that for many scales, the characteristic curves are much more linear in the lower portion than in the upper portion. For example in the range between zero and half load, the resolution of the scale could readily be greater than in the region between half load and full load. It may be very desirable for the user of such a scale to have available a middle range with a fixed zero point in addition to the above-mentioned coarse and fine ranges with selectable zero points.

Components in FIG. 6 which are the same as those in FIG. 3 have corresponding reference numerals. In addition to these components, a switch 64 is provided which is coupled, either electrically or mechanically, to a switch 66. Switch 64 when closed, connects a line 65 and a line 67 to ground potential. When switch 64 is open, switch 66 is in a position connecting the output of clock 16' directly to the counter and tare circuit 48. When switch 64 is closed, switch 66 is in a position wherein the output of clock 16' is frequency divided in a divider 17 and then applied to the counter and tare circuit 48. Grounding of line 65 prevents counter 48 from switching to the coarse measurement range when the fine range limiting weight is reached.

The operation of this system will be illustrated with a numerical example. Let it be assumed that the fine range extends to 300 g with a resolution of 10 mg, that of the coarse measurement range to 3000 g with a resolution of 100 mg. When the scale operates as a two range scale, with a selectable zero point, operation of tare switch 28'' causes the circuit to switch to the fine measurement range. Constant current source 47 furnishes compensation current pulses under the control of control and comparison circuit 46' which have a predetermined amplitude. A count corresponding to the pulse width of these current pulses is furnished by counting the pulses from clock 16' directly in counter and tare circuit 48.

If an object weighing over 300 g is to be weighed, switch 64 is closed thereby setting the scale to the middle range of 1500 g (resolution 10 mg) with a fixed zero point. Simultaneously, the constant current source 47 is switched to a current of half of the previous amplitude and divider 17 is connected into the circuit causing the clock frequency to be divided by two before being applied to counter and tare circuit 48.

The use of divider 17 and of the constant current source having two outputs allows better operation of control and comparison circuit 46' since the effect of the pulse edges and noise effects are reduced. If, however, the operation at full clock frequency and full current is still considered acceptable, divider 17 may be dispensed with and constant current source 47 may be a source which furnishes a current at one predetermined amplitude only.

When the weight exceeds the maximum weight for the middle range, that is 1500 g, the display is blanked completely. If a weight display is desired, switch 64 must be switched back to the position wherein the scale acts as a two range scale. The scale will then operate in the coarse range with the last digit blanked.

A microcomputer can also be used to implement the embodiment shown in FIG. 6. A flow diagram for such a computer is shown in FIG. 8. Those steps which are in common between the embodiments of FIGS. 7 and 8 are not repeated in FIG. 8. For a three range scale, as shown in FIG. 6, the flow chart of FIG. 8 replaces the portion of the flow chart in FIG. 7 from the output of "subtract tare store from input store" to the end of the cycle. In accordance with FIG. 8, it is first tested whether switch 64 is closed. If yes, the test is carried out whether the input store exceeds the third or middle limiting weight. If the weight in the input store exceeds the middle range limiting weight, the display is blanked. If not, linearization for the third range is carried out if required. This step may be omitted if the linearity of the scale in the third range (0–1500 g) is in itself adequate. The net weight is then again computed and loaded into the display store in format 000.00.

If however switch 64 was not closed, a net weight is computed as was described in detail in FIG. 7 and a test is carried out whether the net weight exceeds the fine range limiting weight. If not, the linearization for the fine range is carried out and the linearized net weight is loaded into the display store in format 000.00. If the net weight exceeded the fine range limiting weight, a test is carried out as to whether the numbers stored in the input store exceeds the coarse range limiting weight. If yes, the display is blanked. If no, the coarse range linearization is carried out and the linearized net weight is loaded into the display store in the format 000.0. The cycle then repeats.

It should be noted that the flow chart in FIG. 8 omits the step of testing for the state of switch 42. However this could be inserted, if desired, following the tests of the state of switch 64. Whether such a switch is to be included in a three range scale is a matter of choice.

It should further be noted that the step of loading the net weight into the display in a particular format can be replaced by loading the net weight into display and activating the decimal point in a first or second position, respectively. For the fine range, the number would be displayed as 000.00, while for the coarse range the display would be, 0000.0.

Many other variations of the present invention will be obvious to one skilled in the art. All of these scales have in common that in at least one mode the sensitivity of the display is automatically changed when the measurement range is changed. Further, changes in the measuring range can take place as often as desired by the operator and at arbitrarily selected total weights, so that a new fine measurement range can be started anywhere within the overall measuring range.

The invention is particularly useful when a predetermined resolution is of interest over only part of the total weighing range. This may occur when particular linearization or temperature compensation problems arise. Further, the invention is always applicable when a subtractive tare is provided; that is, when the gross weighing region is decreased by the tare value. In preferred embodiments of the invention, a switching hysteresis is provided when switching from one to the other of the measurement ranges so that possible vibrations to which the scale may be subjected do not lead to an "oscillation" in the range selection circuit, that is do not cause the equipment to continually change from one range to the other when the weight being measured is near the boundary between ranges.

We claim:

1. In a scale adapted to weigh loads ranging from substantially zero weight up to a predetermined maximum weight, said scale having digital display means having a predetermined number of digits and operative throughout a fine measurement range extending from said substantially zero weight to a fine range limiting weight substantially less than said predetermined maximum weight to display weights to a first predetermined resolution and operative in a coarse measurement range extending from said fine range limiting weight to said predetermined maximum weight to display weights to a second predetermined resolution less than said first predetermined resolution, said scale further having range control means connected to said digital display means for automatically switching said digital display means to said coarse measurement range when said weight of said load on said scale exceeds said fine range limiting weight: the improvement comprising additional control means responsive to external activation for switching to the starting point of said fine measurement range at any selected point within said coarse measurement range independently of said weight of said load on said scale, whereby the weight of any component of a load having a plurality of components each weighing less than said fine range limiting weight can be displayed to said first predetermined resolution.

2. Apparatus as set forth in claim 1, wherein said scale further comprises a tare key; and wherein said additional control means are connected to said tare key for activation therewith.

3. Apparatus as set forth in claim 1, further comprising first and second linearization means respectively associated with said coarse and fine measurement range and linearization switch means for switching from said second to said first linearization means when switching from said fine to said coarse measurement range.

4. Apparatus as set forth in claim 1, further comprising switch means operable under external control for switching said digital display means to display weights ranging from said substantially zero weight to said predetermined maximum rate with said second predetermined resolution only.

5. Apparatus as set forth in claim 1, further comprising third range switch means operative under external control for switching said scale to a third measurement range starting at a load having a weight substantially equal to zero and extending to a third range limiting weight greater than said fine range limiting weight but substantially less than said predetermined maximum weight; and wherein said digital display means comprises means for displaying weight in said third measurement range to at least one additional place relative to said coarse measurement range.

6. Apparatus as set forth in claim 1, wherein said range control means comprises blanking circuit means for blanking at least the least significant place associated with said fine measurement range upon switching from said fine measurement range to said coarse measurement range.

7. Apparatus as set forth in claim 6, wherein said additional control means comprises means for re-activating said least significant place when switching from said selected point in said coarse measurement range to said starting point of said fine measurement range.

8. Apparatus as set forth in claim 1, wherein said scale comprises load receiving means for receiving said load to be weighed and furnishing a digital weight signal corresponding to then-present total weight of said load; and microcomputer means connected between said load receiving means and said digital display means for activating said digital display means in accordance with said digital weight signal, said microcomputer means further comprising said range control means and said additional control means.

9. Apparatus as set forth in claim 8, wherein said scale comprises load receiving means, and electromagnetic compensating means for applying a force counteracting the weight of said load to said load receiving means, said electromagnetic compensating means comprising a constant current source, pulse width regulator means for furnishing current pulses having a pulse width corresponding to the weight of said load to said load receiving means, oscillator means for furnishing a sequence of clock pulses at a frequency substantially exceeding the frequency of said current pulses, and counting means for counting the number of clock pulses received within the duration of at least one of said current pulses, the so-counted clock pulses constituting a measure of the weight of said load; further comprising means connected to said constant current source for decreasing the amplitude of current furnished thereby by a predetermined factor upon activation of said third range switch means, frequency divider means for dividing the frequency of a pulse sequence applied thereto by a factor corresponding to said predetermined factor, and means for connecting said frequency divider means to the output of said oscillator means upon activation of said third range switch means.

10. Apparatus as set forth in claim 1, wherein each of said digits of said digital display means represents a decimal digit.

11. Apparatus as set forth in claim 10, wherein said digital display means further comprises means for displaying a decimal point; wherein said range control means comprises means for changing the position of said decimal point from a first position to a second position when switching from said fine to said coarse measurement range; and wherein said additional control means comprises means for switching the position of said decimal point back to said first position in response to said external activation.

12. Apparatus as set forth in claim 11, wherein said digital display means includes means for displaying a decimal point in a first or second position in said display; wherein said scale further comprises a tare key adapted for external activation; and wherein said microcomputer comprises memory means for storing a program, a random access memory, and a processing unit for storing the then-present weight signal in said random access memory upon activation of said tare key thereby furnishing a stored tare value, substracting said stored tare value, if present, from a subsequently occurring weight signal thereby furnishing a net weight signal, comparing said net weight signal to a predetermined fine range limiting weight, and adjusting the position of said decimal point in accordance with the result of said comparison.

13. Electrical scale for weighing loads having a plurality of separately applied components, comprising, in combination, means for furnishing a load signal corresponding at any instant to the total weight on said scale; digital display means for furnishing a digital display of display input signals applied thereto; storage means for furnishing a stored signal in response to storage input signals; display signal furnishing means connected to said load signal furnishing means, said storage means and said display means for furnishing display input signals corresponding to the difference between said load signal and said stored signal, said display signal furnishing means further comprising means for activating said digital display to a predetermined least significant place while said display input signals correspond to weights ranging between substantially zero and a predetermined fine range limiting weight and for changing the activation of said display means to exclude said least significant place when said display input signals are indicative of weights between said fine range limiting weight and a predetermined maximum weight substantially exceeding said fine range limiting weight; and switch means operative under external control for briefly connecting said display signal furnishing means to said storage means so that said stored signal corresponds to the then-present display input signals, whereby said digital display is reset to zero and said least significant place is reactivated automatically upon operation of said switch means.

14. An electrical scale as set forth in claim 13, wherein said display signal furnishing means comprises an up/down counter counting up in response to said load signal and set to a negative count in response to said stored signal; and wherein said display activating means comprises means for changing the activation of said display means to exclude said least significant place when the count on said counter is indicative of said fine range limiting weight and for reactivating said least significant place of said display when the count on said counter passes through zero.

15. An electrical scale as set forth in claim 13, wherein said display signal furnishing means comprises an up/down counter counting up in response to said load signal and set to a negative count in response to said stored signal; and wherein said display activating means comprises means for changing the activation of said display means to exclude said least significant place when the count on said counter is indicative of said fine range limiting weight and for reactivating said least significant place of said display directly in response to activation of said switch means.

* * * * *

UNITED STATES PATENT AND TRADEMARK OFFICE
CERTIFICATE OF CORRECTION

PATENT NO. : 4,149,605

DATED : 3/17/79

INVENTOR(S) : Mettler et al

It is certified that error appears in the above-identified patent and that said Letters Patent are hereby corrected as shown below:

Column 4, line 41 "00.00" is changed to --000.0--;

Column 9, line 29 "11" is changed to --8--; --means-- is inserted following "microcomputer".

Signed and Sealed this

Second Day of October 1979

[SEAL]

Attest:

RUTH C. MASON
Attesting Officer

LUTRELLE F. PARKER
Acting Commissioner of Patents and Trademarks